United States Patent
Horn

(10) Patent No.: US 12,135,339 B2
(45) Date of Patent: Nov. 5, 2024

(54) MEASUREMENT DEVICE AND MEASUREMENT METHOD WITH ADVANCED TRIGGER

(71) Applicant: Rohde & Schwarz GmbH & Co. KG, Munich (DE)

(72) Inventor: Armin Horn, Columbia, MD (US)

(73) Assignee: Rohde & Schwarz GmbH & Co, Munich (DE)

( * ) Notice: Subject to any disclaimer, the term of this patent is extended or adjusted under 35 U.S.C. 154(b) by 65 days.

(21) Appl. No.: 16/517,164

(22) Filed: Jul. 19, 2019

(65) Prior Publication Data

US 2021/0018536 A1     Jan. 21, 2021

(51) Int. Cl.
*G01R 13/02*     (2006.01)
(52) U.S. Cl.
CPC ................ *G01R 13/0254* (2013.01)
(58) Field of Classification Search
CPC . G01R 13/0254; G01R 13/0218; G01R 13/02
See application file for complete search history.

(56) References Cited

U.S. PATENT DOCUMENTS

| | | | | |
|---|---|---|---|---|
| 6,624,829 | B1 * | 9/2003 | Beck ....................... | G06F 11/25 702/68 |
| 10,656,183 | B2 * | 5/2020 | Kelly ..................... | G01R 13/32 |
| 2002/0176342 | A1 * | 11/2002 | Worthington .... | G01N 35/00069 369/53.31 |
| 2007/0200550 | A1 * | 8/2007 | Corredoura ........ | G01R 13/0254 324/121 R |
| 2007/0282542 | A1 * | 12/2007 | Duff .................... | G01R 13/0254 702/35 |
| 2008/0155345 | A1 * | 6/2008 | Edgar ................... | G06F 11/364 714/45 |
| 2008/0297139 | A1 | 12/2008 | Freidhof et al. | |
| 2009/0249363 | A1 * | 10/2009 | Dobyns .............. | G01R 13/0263 719/318 |
| 2016/0299181 | A1 * | 10/2016 | Reich ................. | G01R 13/0263 |
| 2017/0201239 | A1 | 7/2017 | Smith et al. | |
| 2019/0383873 | A1 * | 12/2019 | Hojabri .............. | G01R 31/3167 |

OTHER PUBLICATIONS

Quinn, "A Primer on Indefiniteness and Means Plus Function", published on Nov. 15, 2017, retrieved at Jul. 19, 2019, from https://www.ipwatchdog.com/2017/11/15/primer-indefiniteness-means-plus-function/id=89708/, 8 pages.
Rohde & Schwarz USA, Inc. "Oscilloscope Fundamentals Primer", version 1.1, retrieved on Jul. 19, 2019 from http://www.rohde-schwarz-usa.com/rs/rohdeschwarz/images/Oscilloscope-Fundamentals_v1.1.pdf, 26 pages.

* cited by examiner

*Primary Examiner* — Mohamed Charioui
(74) *Attorney, Agent, or Firm* — DITTHAVONG, STEINER & MLOTKOWSKI

(57) ABSTRACT

A measurement device is provided. The measurement device comprises an input, and a trigger unit. In this context, the input is configured to receive an input signal. In addition to this, the trigger unit is configured to trigger according to a first trigger condition with respect to said input signal or according to at least one second trigger condition with respect to said input signal.

12 Claims, 2 Drawing Sheets

MEASUREMENT DEVICE AND MEASUREMENT METHOD WITH ADVANCED TRIGGER

TECHNICAL FIELD

The invention relates to a measurement device and a measurement method especially with an advanced trigger, wherein it is triggered according to a trigger condition.

BACKGROUND ART

Generally, in times of an increasing number of applications employing multiple circuitries, there is a growing need of a measurement device and a measurement method especially with an advanced trigger for performing measurements with respect to a device under test comprising such an application in order to verify correct functioning of said applications in a highly accurate and efficient manner.

US 2008/0297139 A1 provides an approach for digital triggering a recording of one or more digitized signals on a digital oscilloscope by means of carrying out a level comparison for determining a triggering instant in each case between two successive sample values of a reference signal and a threshold values. According to the approach, at least one additional sample value of the reference signal is determined between two sequential samples of the reference signals by means of interpolation. Disadvantageously, especially due to the additional sample, said approach is quite inefficient.

OR-triggering as such is known from US 2017/0201239 A1. However, it is only used across at least two different input channels.

Accordingly, there is a need to provide a measurement device and a measurement method especially with an advanced trigger, whereby both a high accuracy and a high efficiency are ensured.

SUMMARY OF THE INVENTION

According to a first aspect of the invention, a measurement device is provided. The measurement device comprises an input, and a trigger unit. In this context, the input is configured to receive an input signal. In addition to this, the trigger unit is configured to trigger according to a first trigger condition with respect to said input signal or according to at least one second trigger condition also with respect to said input signal. Advantageously, both a high accuracy and a high efficiency can be ensured.

According to a first preferred implementation form of the first aspect of the invention, the measurement device comprises or is a signal analyzer. Advantageously, for instance, accuracy and efficiency of signal analyzers can be increased.

According to a second preferred implementation form of the first aspect of the invention, the measurement device further comprises a digitizer, wherein the digitizer is configured to digitize the input signal, preferably received through the same input channel of the measurement device. Advantageously, for example, signal complexity can be reduced, thereby increasing efficiency.

According to a further preferred implementation form of the first aspect of the invention, the measurement device further comprises an acquisition memory, wherein the acquisition memory is configured to store the digitized input signal. Advantageously, for instance, efficiency can further be increased.

According to a further preferred implementation form of the first aspect of the invention, the measurement device further comprises a detector, wherein the detector is configured to detect which of the first trigger condition and the at least one second trigger condition is met. Advantageously, for example, accuracy can further be increased.

According to a further preferred implementation form of the first aspect of the invention, the detector comprises or is a processor. Advantageously, for instance, complexity can be reduced, which leads to an increased efficiency.

According to a further preferred implementation form of the first aspect of the invention, the detector is further configured to output the respective detection result to a display. Advantageously, for example, efficiency can further be increased. Further advantageously, for a user, it is easier to distinguish between different triggers.

According to a further preferred implementation form of the first aspect of the invention, the measurement device comprises the display. Advantageously, for instance, compactness can be ensured.

According to a further preferred implementation form of the first aspect of the invention, the detector is further configured to output the respective detection result to an audio output device, preferably a speaker. Advantageously, for example, for a user, it is easier to distinguish between different triggers.

According to a further preferred implementation form of the first aspect of the invention, the measurement device comprises the audio output device, preferably the speaker. Advantageously, for instance, compactness can be ensured, thereby increasing efficiency.

According to a further preferred implementation form of the first aspect of the invention, the input signal comprises protocol data. Advantageously, for example, inefficiency can be reduced.

According to a further preferred implementation form of the first aspect of the invention, the trigger unit is configured to set the first trigger condition to a protocol data pattern. Advantageously, for instance, accuracy can be increased.

According to a further preferred implementation form of the first aspect of the invention, the protocol data pattern comprises at least one of a read burst, a write burst, a preamble, or any combination thereof. Advantageously, for example, efficiency can be increased.

According to a further preferred implementation form of the first aspect of the invention, the trigger unit is configured to set the at least one second trigger condition to a protocol data pattern. Advantageously, for instance, inaccuracy can be reduced.

According to a further preferred implementation form of the first aspect of the invention, the protocol data pattern comprises at least one of a read burst, a write burst, a preamble, or any combination thereof. Advantageously, for example, inefficiency can be reduced.

According to a further preferred implementation form of the first aspect of the invention, the trigger unit is configured to set the first trigger condition to a protocol data error pattern. Advantageously, for instance, for a user, it is easier to search for unwanted signal patterns, which leads to an increased efficiency.

According to a further preferred implementation form of the first aspect of the invention, the trigger unit is configured to set the at least one second trigger condition to a protocol data error pattern. Advantageously, for example, for a user, it is easier to search for unwanted signal patterns, thereby increasing efficiency.

According to a further preferred implementation form of the first aspect of the invention, the detector is further configured to output the respective detection result in the form of a trigger event notification. Advantageously, for instance, efficiency can be increased.

According to a further preferred implementation form of the first aspect of the invention, the trigger event notification comprises or makes use of at least one of a textual status display, preferably a text field, a graphical status display, preferably an icon, audio signals, preferably beeping or alarm sounds, dialogs, preferably popup dialogs or info boxes, a hardware display, preferably a LED display, messages, preferably e-mails or test-messages, or any combination thereof. Advantageously, for example, efficiency can further be increased.

According to a second aspect of the invention, a measurement method is provided. The measurement method comprises the steps of receiving an input signal, and triggering according to a first trigger condition with respect to said input signal or according to at least one second trigger condition with respect to said input signal. Advantageously, both a high accuracy and a high efficiency can be ensured.

BRIEF DESCRIPTION OF THE DRAWINGS

Exemplary embodiments of the invention are now further explained with respect to the drawings by way of example only, and not for limitation. In the drawings.

DETAILED DESCRIPTION OF THE PREFERRED EMBODIMENTS

Figure 1:
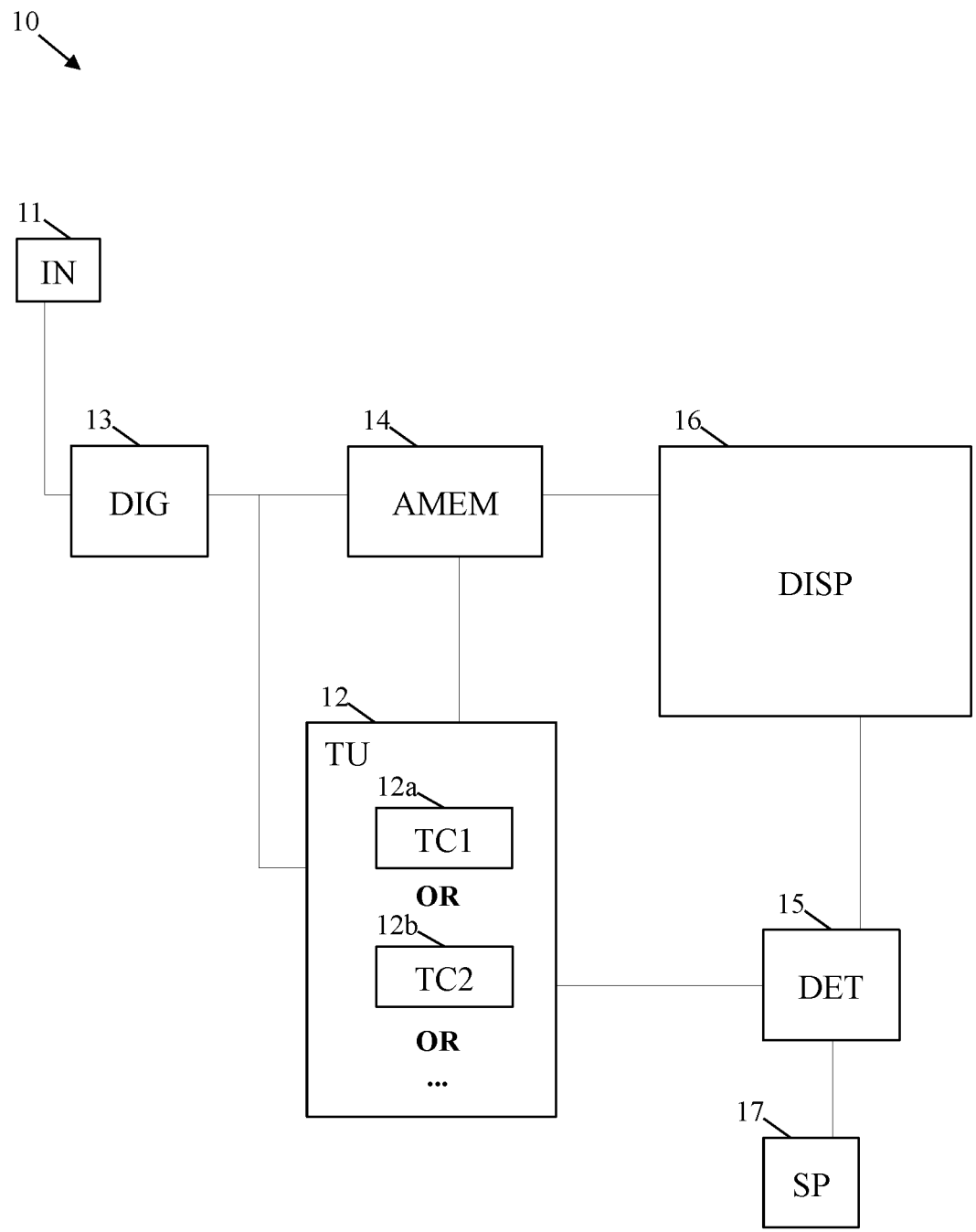
FIG. 1 shows an exemplary embodiment of the first aspect of the invention.

Firstly, FIG. 1 illustrates an exemplary embodiment of the inventive measurement device 10. The measurement device 10 comprises an input 11, a trigger unit 12, a digitizer 13, an acquisition memory 14, a detector 15, a display 16, and a speaker 17.

In this context, the input 11 receives an input signal, and the trigger unit 12 triggers according to a first trigger condition 12a with respect to said input signal or according to at least one second trigger condition 12b with respect to the same input signal.

With respect to the input 11, it is noted that the input 11 may comprise or be an input circuit. Furthermore, with respect to the input signal, it is noted that the input signal may comprise or be a signal to be measured. Moreover, with respect to the trigger unit 12, it is noted that the trigger unit 12 may comprise or be a trigger or a trigger circuit.

In addition to this, with respect to the first trigger condition 12a or the at least one second trigger condition 12b, respectively, it is noted that a trigger condition may comprise or be a condition for triggering or a trigger event.

As it can further be seen from FIG. 1, the input 11 firstly provides the input signal for the digitizer 13. In other words, an output of the input 11 is connected to an input of the digitizer 13.

With respect to the digitizer 13, it is noted that the digitizer 13 may comprise or be a digitizer circuit or an analog-to-digital converter.

Furthermore, the digitizer 13 provides the respective digitized input signal for the trigger unit 12. In other words, the an output of the digitizer 13 is connected to an input of the trigger unit 12.

Optionally, the output of the digitizer may be also connected to an input of the acquisition memory 14.

Additionally, the trigger unit 12 may be connected to the acquisition memory 14.

Moreover, the acquisition memory 14 is connected to the display 16. In addition to this, the detector 15 is connected to the trigger unit 12, the display 16, and the speaker 17.

It is noted that the measurement device 10 may especially comprise or be a signal analyzer. With respect to the digitizer 13, it is noted that the digitizer 13 digitizes the input signal. With respect to the acquisition memory 14, it should be mentioned that the acquisition memory 14 stores the digitized input signal.

Alternatively, the measurement device 10 may comprise or be an oscilloscope. The oscilloscope may especially be a digital sampling oscilloscope, a real-time sampling oscilloscope, or a mixed-signal oscilloscope.

With respect to the digital sampling oscilloscope, it is noted that the digital sampling oscilloscope may sample the signal before any signal conditioning such as attenuation or amplification is performed. Its design allows the instrument to have very broad bandwidth. Unlike some other types of digital oscilloscopes, a digital sampling oscilloscope can capture signals that have frequency components much higher than the instrument's sample rate. This makes it possible to measure much faster repetitive signals than with any other type of oscilloscope. As a result, digital sampling oscilloscopes may preferably be used in very-high-bandwidth applications such as fiber optics.

Moreover, with respect to the above-mentioned real-time sampling oscilloscope, it is noted that the benefits of real-time sampling especially become apparent when the frequency range of a signal is less than half that of an oscilloscope's maximum sample rate. This technique allows the instrument to acquire a very large number of points in a single sweep to produce a highly precise display. It is currently the only method capable of capturing the fastest single-shot transient signals.

Board-level embedded systems typically encompass 1-bit signals, clocked and unclocked parallel and serial buses, and standardized or proprietary transmission formats. All of these paths must be analyzed, which typically requires complex test setups and multiple instruments. It is also often necessary to display both analog and digital signals. For this purpose, the respective oscilloscopes may have specific options, which turn the digital oscilloscope into a hybrid instrument with analysis capabilities of a logic analyzer. This is especially valuable for quickly debugging digital circuits because of its digital triggering capability, high resolution, acquisition capability, and analysis tools.

In addition to this, with respect to the above-mentioned mixed-signal oscilloscopes, it is noted that mixed-signal oscilloscopes especially expand the digital oscilloscope's functionality to include logic and protocol analysis, which simplifies the test bench and allows synchronous visualization of analog waveforms, digital signals, and protocol details within a single instrument. Hardware developers may preferably use mixed-signal oscilloscopes to analyze signal integrity, while software developers may use them to analyze signal content.

Such a mixed-signal oscilloscope may preferably have two or four analog channels and many more digital channels. Analog and digital channels are acquired synchronously so they can be correlated in time and analyzed in one instrument.

Furthermore, with respect to the detector 15, it is noted that the detector 15 detects which of the first trigger condition 12a and the at least one second trigger condition 12b is met. In this context, it might be particularly advantageous if the detector 15 comprises or is a processor or a detector circuit.

Again, with respect to the detector 15, it is noted that the detector 15 outputs the respective detection result to the display 16. In addition to this, the detector 15 outputs the respective detection result to the speaker 17.

Moreover, with respect to the input signal, it is noted that the input signal may especially comprise protocol data. It is further noted that the trigger unit 12 may preferably set the first trigger condition 12a to a protocol data pattern. In this context, the protocol data pattern may especially comprise at least one of a read burst, a write burst, a preamble, or any combination thereof.

Again, with respect to the trigger unit 12, the trigger unit may additionally or alternatively set the at least one second trigger condition 12b to a protocol data pattern. In this context, as already mentioned above, the protocol data pattern may comprise at least one of a read burst, a write burst, a preamble, or any combination thereof.

It is noted that the trigger unit 12 may especially set the first trigger condition 12a to a protocol data error pattern. It is further noted that the trigger unit 12 may especially set the at least one second trigger condition 12b to a protocol data error pattern. Again, with respect to the detector 15, it is noted that the detector 15 may preferably output the respective detection result in the form of a trigger event notification.

In this context, it might be particularly advantageous if the trigger event notification comprises or makes use of at least one of a textual status display, preferably a text field, a graphical status display, preferably an icon, audio signals, preferably beeping or alarm sounds, dialogs, preferably popup dialogs or info boxes, a hardware display, preferably a LED display, messages, preferably e-mails or test-messages, or any combination thereof.

Figure 2:
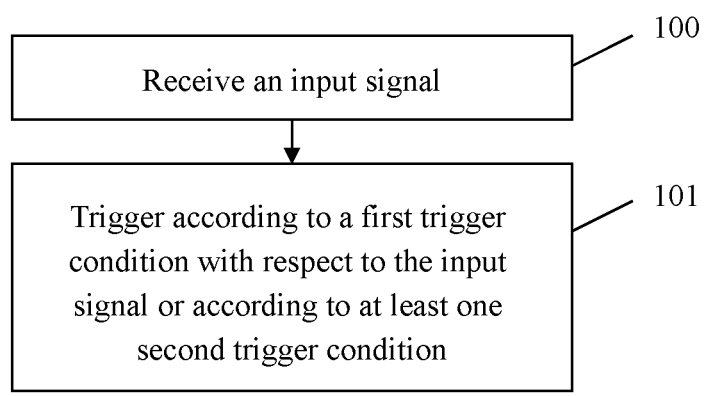
FIG. 2 shows a flow chart of an exemplary embodiment of the second aspect of the invention.

Finally, FIG. 2 shows a flow chart of an exemplary embodiment of the inventive measurement method. In a first step 100, an input signal is received. Then, in a second step 101, it is triggered according to a first trigger condition with respect to the input signal or according to at least one second trigger condition.

In this context, it might be particularly advantageous if the input signal is received with the aid of an input of a measurement device. Additionally, the step of triggering according to a first trigger condition with respect to the input signal or according to at least one second trigger condition may be performed by a trigger unit of the measurement device.

It is noted that the measurement device may preferably comprise or be a signal analyzer. It is further noted that the measurement device may further comprise a digitizer, wherein the digitizer is configured to digitize the input signal. In other words, the measurement method may further comprise the step of digitizing the input signal.

Furthermore, the measurement device may further comprise an acquisition memory, wherein the acquisition memory is configured to store the digitized input signal. In other words, the measurement method may further comprise the step of storing the digitized input signal.

Moreover, it might be particularly advantageous if the measurement device further comprises a detector, wherein the detector is configured to detect which of the first trigger condition and the at least one second trigger condition is met, preferably with the same input channel of the measurement device.

With respect to the input channel, it is noted that the input channel may comprise or be a channel, especially a measurement channel, comprising the input signal.

In other words, the measurement method may further comprise the step of detecting which of the first trigger condition and the at least one second trigger condition is met. In this context, the detector may preferably comprise or be a processor. Additionally or alternatively, the detector may further be configured to output the respective detection result to a display.

In other words, the measurement method may further comprise the step of outputting the respective detection result to a display. With respect to the measurement device, it is noted that the measurement device may preferably comprise the display.

Furthermore, the detector may additionally or alternatively be configured to output the respective detection result to an audio output device, preferably a speaker. In other words, the measurement method may further comprise the step of outputting the respective detection result to an audio output device, preferably a speaker. With respect to the measurement device, it is noted that the measurement device may especially comprise the audio output device, preferably the speaker.

With respect to the input signal, it is noted that the input signal may preferably comprise protocol data. Moreover, the trigger unit may be configured to set the first trigger condition to a protocol data pattern. In other words, the measurement method may further comprise the step of setting the first trigger condition to a protocol data pattern.

In this context, the protocol data pattern may especially comprise at least one of a read burst, a write burst, a preamble, or any combination thereof. In addition to this or as an alternative, the trigger unit may be configured to set the at least one second trigger condition to a protocol data pattern.

In other words, the measurement method may additionally or alternatively comprise the step of setting the at least one second trigger condition to a protocol data pattern. In this context, as already mentioned above, the protocol data pattern may comprise at least one of a read burst, a write burst, a preamble, or any combination thereof.

Furthermore, the trigger unit may be configured to set the first trigger condition to a protocol data error pattern. In other words, the measurement method may further comprise the step of setting the first trigger condition to a protocol data error pattern.

In addition to this or as an alternative, the trigger unit may be configured to set the at least one second trigger condition to a protocol data error pattern. In other words, the measurement method may additionally or alternatively comprise the step of setting the at least one second trigger condition to a protocol data error pattern.

Again, with respect to the detector, it is noted that the detector may further be configured to output the respective detection result in the form of a trigger event notification. In other words, the measurement method may further comprise the step of outputting the respective detection result in the form of a trigger event notification.

In this context, it might be particularly advantageous if the trigger event notification comprises or makes use of at least one of a textual status display, preferably a text field, a graphical status display, preferably an icon, audio signals, preferably beeping or alarm sounds, dialogs, preferably popup dialogs or info boxes, a hardware display, preferably a LED display, messages, preferably e-mails or test-messages, or any combination thereof.

While various embodiments of the present invention have been described above, it should be understood that they have been presented by way of example only, and not limitation.

Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of serveral implementations, such feature may be combined with one or more other features of the other implementations as may be desired and advantageous for any given or particular application.

What is claimed is:

1. A measurement device comprising:
an input,
a trigger unit, and
a detector,
wherein the input is configured to receive an input signal,
wherein the trigger unit is configured to trigger according to a first trigger condition with respect to said input signal or according to at least one second trigger condition with respect to said input signal,
wherein the detector is configured to detect which of the first trigger condition and the at least one second trigger condition is met,
wherein the detector is further configured to output the respective detection result regarding the detection of the first trigger condition or the at least one second trigger condition to a display,
wherein the detector is further configured to output the respective detection result in the form of a trigger event notification,
wherein the trigger event notification comprises or makes use of at least emails,
wherein the trigger unit is configured to set the first trigger condition to a protocol data pattern comprising at least a preamble, and
wherein the trigger unit is configured to set the at least one second trigger condition to a protocol data error pattern.

2. The measurement device according to claim 1, wherein the measurement device comprises or is a signal analyzer.

3. The measurement device according to claim 1,
wherein the measurement device further comprises a digitizer, wherein the digitizer is configured to digitize the input signal.

4. The measurement device according to claim 3,
wherein the measurement device further comprises an acquisition memory, wherein the acquisition memory is configured to store the digitized input signal.

5. The measurement device according to claim 1,
wherein the detector comprises or is a processor.

6. The measurement device according to claim 1,
wherein the measurement device comprises the display.

7. The measurement device according to claim 1,
wherein the detector is further configured to output the respective detection result to an audio output device.

8. The measurement device according to claim 7,
wherein the measurement device comprises the audio output device.

9. The measurement device according to claim 1,
wherein the input signal comprises protocol data.

10. The measurement device according to claim 1,
wherein the trigger unit is configured to set the at least one second trigger condition to a protocol data pattern.

11. The measurement device according to claim 1,
wherein the textual status display comprises a text field, and/or
wherein the graphical status display comprises an icon, and/or
wherein the trigger event notification comprises or makes use of at least one of audio signals, dialogs, a hardware display, messages, or any combination thereof.

12. A measurement method comprising the steps of:
receiving an input signal,
triggering according to a first trigger condition with respect to said input signal or according to at least one second trigger condition with respect to said input signal,
detecting which of the first trigger condition and the at least one second trigger condition is met,
outputting the respective detection result regarding the detection of the first trigger condition or the at least one second trigger condition to a display, and
outputting the respective detection result in the form of a trigger event notification,
wherein the trigger event notification comprises or makes use of at least emails,
wherein the first trigger condition is a protocol data pattern comprising at least a preamble, and
wherein the at least one second trigger condition is a protocol data error pattern.

* * * * *